US012633931B2

(12) United States Patent
Kang et al.

(10) Patent No.: US 12,633,931 B2
(45) Date of Patent: May 19, 2026

(54) PHASE-LOCKED LOOP CIRCUIT INCLUDING A PLURALITY OF CAPACITOR CELLS AND METHOD OF CONTROLLING THE SAME

(71) Applicant: Samsung Electronics Co., Ltd., Suwon-si (KR)

(72) Inventors: Pillseong Kang, Suwon-si (KR); Chulho Kim, Suwon-si (KR); Sangho Lee, Suwon-si (KR); Joonhee Lee, Suwon-si (KR); Ikkyun Jo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/809,865

(22) Filed: Aug. 20, 2024

(65) Prior Publication Data

US 2025/0080124 A1       Mar. 6, 2025

(30) Foreign Application Priority Data

Sep. 1, 2023    (KR) ......................... 10-2023-0116329
Nov. 9, 2023    (KR) ......................... 10-2023-0154774

(51) Int. Cl.
H03L 7/099       (2006.01)
H03L 7/093       (2006.01)

(52) U.S. Cl.
CPC ............ H03L 7/0991 (2013.01); H03L 7/093 (2013.01); H03L 2207/06 (2013.01)

(58) Field of Classification Search
CPC ............................... H03L 7/0991; H03L 7/093

USPC ........................................................ 327/156
See application file for complete search history.

(56) References Cited

U.S. PATENT DOCUMENTS

| | | | |
|---|---|---|---|
| 6,747,522 | B2 | 6/2004 | Pietruszynski et al. |
| 7,417,512 | B2 | 8/2008 | Lee |
| 9,077,351 | B2 | 7/2015 | Park et al. |
| 9,356,555 | B2 | 5/2016 | Loke et al. |
| 9,490,825 | B2 | 11/2016 | Rey et al. |

(Continued)

FOREIGN PATENT DOCUMENTS

CN          106817126 A       6/2017

OTHER PUBLICATIONS

Extended European Search Report dated Feb. 3, 2025 for corresponding European Application No. 24197021.9.

*Primary Examiner* — Tomi Skibinski
(74) *Attorney, Agent, or Firm* — Fish & Richardson P.C.

(57)       ABSTRACT

A phase-locked loop circuit includes an oscillator including a plurality of capacitor cells, and a control logic circuit that receives an output from the oscillator. The control logic circuit compares a target frequency with a first frequency of a first signal output from the oscillator, generates a first input code to control at least a portion of the plurality of capacitor cells to output a signal having the target frequency based on the comparison, generates a first output code corresponding to the first input code when the first input code is within a predetermined range of input codes, and controls at least two capacitor cells from among the plurality of capacitor cells based on the first output code. The oscillator may output a second signal having a second frequency through an electrical path including capacitor cells other than grounded capacitor cells from among the plurality of capacitor cells.

20 Claims, 20 Drawing Sheets

(56)        References Cited

U.S. PATENT DOCUMENTS

| | | |
|---|---|---|
| 10,103,740 B2 | 10/2018 | Pavao Moreira et al. |
| 2010/0052795 A1 | 3/2010 | Nakamura et al. |
| 2010/0265001 A1 | 10/2010 | Tsuda et al. |
| 2018/0123606 A1* | 5/2018 | Cai .......................... H03L 7/099 |

* cited by examiner

C11A

<u>C11B</u>

PHASE-LOCKED LOOP CIRCUIT INCLUDING A PLURALITY OF CAPACITOR CELLS AND METHOD OF CONTROLLING THE SAME

CROSS-REFERENCE TO RELATED APPLICATION(S)

This U.S. non-provisional application claims priority under 35 USC § 119 to Korean Patent Application No. 10-2023-0116329, filed on Sep. 1, 2023, and Korean Patent Application No. 10-2023-0154774, filed on Nov. 9, 2023, in the Korean Intellectual Property Office, the disclosures of which are herein incorporated by reference in their entirety.

BACKGROUND

The present disclosure relates to phase-locked loop circuits including a plurality of capacitor cells and methods of controlling the same.

A phase-locked loop (PLL) circuit is a control circuit generating an output clock signal having a desired (and/or alternatively predetermined) phase (or frequency). The phase-locked loop circuit may generate a system clock used in various digital products. A digital phase-locked loop (DPLL) based on digital control may be used as an example of a phase-locked loop circuit.

A digital phase-locked loop (DPLL) may include a digitally controlled oscillator (DCO). The DPLL may control a plurality of capacitor cells, included in the DCO, to control a phase (or frequency) of an output signal.

Such a phase-locked loop (PLL) circuit may ground or connect at least a portion of the plurality of capacitor cells, included in the oscillator, to a power supply voltage to control an electrical path through which a clock signal is generated.

Recently, there is increasing demand for digital phase-locked loops (DPLL) supporting various frequency bands such as 3G, LTE, and 5G.

However, in the case of a phase-locked loop supporting multiple frequency bands, controlling a frequency in a low band requires more precise control of a capacitor than controlling a frequency in a high band in consideration of characteristics of the capacitor.

Accordingly, the time required for the phase-locked loop circuit to output a phase-locked signal in the low band may increase.

SUMMARY

Some example embodiments provide a phase-locked loop circuit which may reduce the time required for an oscillator to output a signal having a desired (and/or alternatively predetermined) frequency.

Some example embodiments of the inventive concepts provide a phase-locked loop circuit that includes an oscillator including a capacitor cell array in which a plurality of capacitor cells are arranged, and a control logic circuit that receives an output from the oscillator. The control logic circuit compares a target frequency with a first frequency of a first signal output from the oscillator; generates a first input code to control at least a portion of the plurality of capacitor cells to output a signal from the oscillator having the target frequency, based on the comparison of the target frequency with the first frequency; generates a first output code corresponding to the first input code when the first input code is within a desired predetermined range of input codes; and controls at least two capacitor cells from among the plurality of capacitor cells based on the first output code. The oscillator may output a second signal having a second frequency through an electrical path including capacitor cells other than grounded capacitor cells from among the plurality of capacitor cells.

Some example embodiments of the inventive concepts further provide a method of controlling a phase-locked loop circuit that includes comparing a target frequency with a first frequency of a first signal output from an oscillator of the phase-locked loop circuit; generating a first input code to control at least a portion of a plurality of capacitor cells included in the oscillator based on the comparing; generating a first output code corresponding to the first input code when the first input code is within a predetermined range of input codes; controlling at least two capacitor cells from among the plurality of capacitor cells based on the first output code; and outputting, by the oscillator, a second signal having a second frequency through an electrical path including capacitor cells from among the plurality of capacitor cells that are connected to a power supply voltage.

Some example embodiments of the inventive concepts still further provide a phase-locked loop device that includes an oscillator including a plurality of capacitor cells respectively connected to a plurality of row control lines and a plurality of column control lines; and a control logic circuit that receives an output from the oscillator. The control logic circuit outputs a first output code to control at least two capacitor cells from among the plurality of capacitor cells based on a result of comparison between a target frequency and a first frequency of a first signal output from the oscillator. The oscillator outputs a second signal having a second frequency through an electrical path including capacitor cells other than grounded capacitor cells from among the plurality of capacitor cells, based on the first output code.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Also, for example, "at least one of A, B, and C" and similar language (e.g., "at least one or one selected from the group consisting of A, B, and C") may be construed as A only, B only, C only, or any combination of two or more of A, B, and C, such as, for instance, ABC, AB, BC, and AC.

Figure 1A:
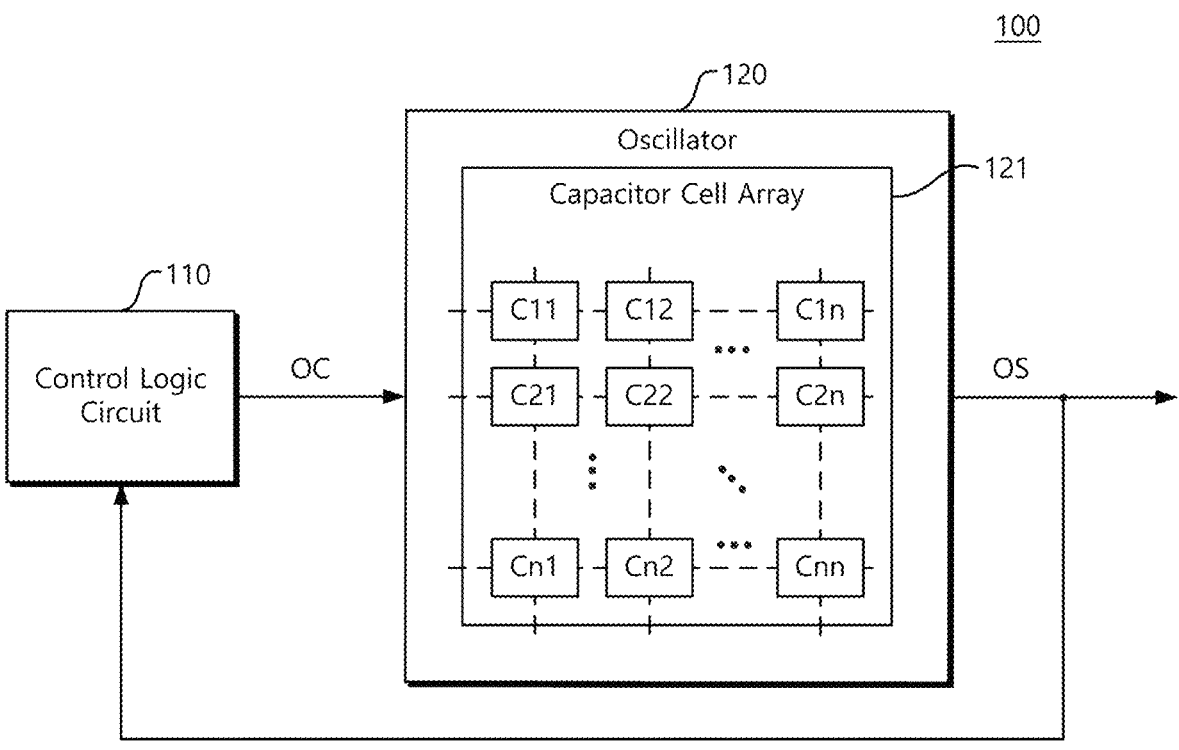
FIG. 1A is a block diagram illustrating a phase-locked loop circuit according to some example embodiments.
Figure 1B:
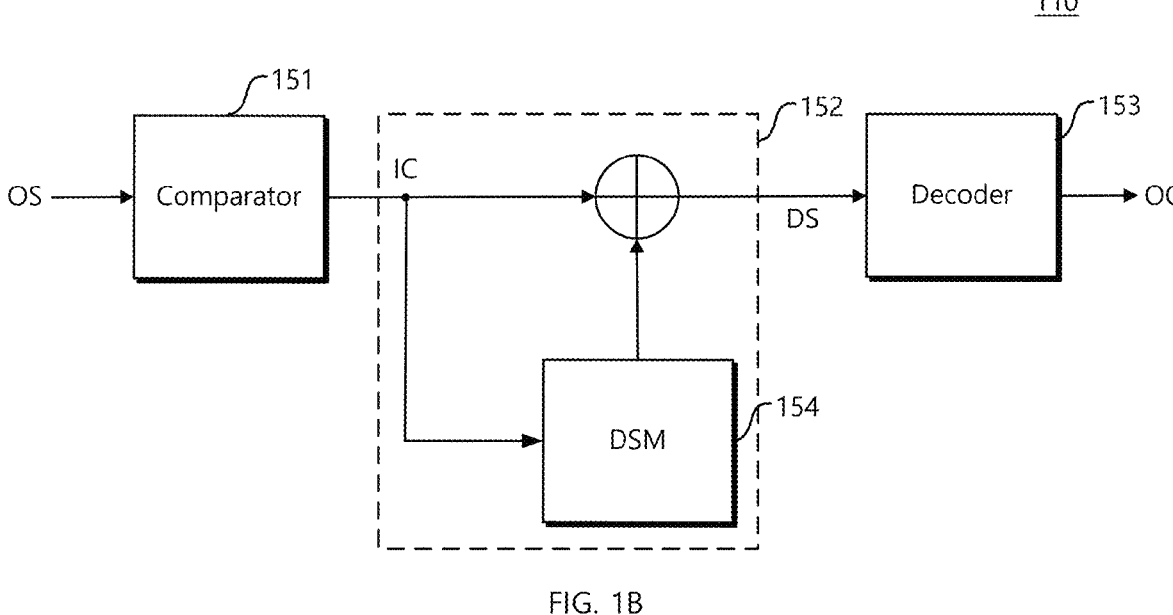
FIG. 1B is a circuit diagram illustrating a configuration of a control logic circuit according to some example embodiments.

FIG. 1A is a block diagram illustrating a phase-locked loop circuit according to some example embodiments, and FIG. 1B is a circuit diagram illustrating a configuration of a control logic circuit according to some example embodiments.

Referring to FIGS. 1A and 1B, a phase-locked loop (PLL) circuit 100 according to an Some example embodiments may include a control logic circuit 110 and an oscillator 120. The phase-locked loop circuit 100 may also be referred to as a phase-locked loop (PLL) device.

Referring to FIG. 1A, the phase-locked loop circuit 100 according to some example embodiments may include an oscillator 120 outputting an output signal OS in response to an output code OC. For example, the output signal OS may be understood as a clock signal having a specific frequency.

According to some example embodiments, the oscillator 120 may include a plurality of capacitor cells C11 to Cnn. For example, the oscillator 120 may include a capacitor cell array 121 including a plurality of capacitor cells C11 to Cnn arranged in a matrix.

A plurality of capacitor cells C11 to Cnn may be arranged in an n×n array. For example, the plurality of capacitor cells C11 to Cnn may be arranged in the form of a matrix corresponding to n rows and n columns.

For example, the plurality of capacitor cells C11 to Cnn may include 1024 capacitor cells arranged in a 32×32 array.

For example, each of the plurality of capacitor cells C11 to Cnn may include at least one capacitor having desired (and/or alternatively predetermined) capacitance.

According to some example embodiments, the phase-locked loop circuit 100 may include a control logic circuit 110 connected to an oscillator 120. For example, the phase-locked loop circuit 100 may include a control logic circuit 110 receiving an output signal OS output from the oscillator 120.

The control logic circuit 110 may execute, for example, software or a program to control one or more other components (for example, the oscillator 120) of the phase-locked loop circuit 100, and may perform various data processing or operations. The control logic circuit 110 may include a central processing unit, a microprocessor, or the like, and may control the overall operation of the phase-locked loop circuit 100. Therefore, an operation performed by the phase-locked loop circuit 100 may be understood below as being performed under the control of the control logic circuit 110.

According to some example embodiments, the control logic circuit 110 may include an algorithm for controlling the oscillator 120 or the plurality of capacitor cells C11 to Cnn. For example, the algorithm may be a software code programmed in the control logic circuit 110. For example, the algorithm may be hard-coded into the control logic circuit 110, but other example embodiments are not limited thereto.

The control logic circuit 110 may control at least a portion of the plurality of capacitor cells C11 to Cnn, included in the oscillator 120, based on the algorithm.

Referring to FIG. 1B, a control logic circuit 110 according to some example embodiments may include a comparator 151, a dithering circuit 152, and a decoder 153.

According to some example embodiments, the control logic circuit 110 may receive at comparator 151 an output signal OS output from the oscillator 120.

Further, the control logic circuit 110 may compare a frequency of the output signal OS, output from the oscillator 120, with a target frequency using the comparator 151.

For example, the control logic circuit 110 may compare a first frequency of a first signal, output from the oscillator 120, with the target frequency using the comparator 151.

For example, the target frequency may be stored in a storage space inside the phase-locked loop circuit 100.

The control logic circuit 110 may generate an input code IC based on a result of the comparison between the frequency of the output signal OS and the target frequency.

For example, the control logic circuit 110 may generate an input code IC for controlling the oscillator 120 to output a signal having the target frequency based on the result of comparing the frequency of the output signal OS and the target frequency using the comparator 151.

For example, when a difference between the frequency of the output signal OS and the target frequency is greater than a desired (and/or alternatively predetermined) difference, the control logic circuit 110 may generate an input code IC for controlling at least a portion of the capacitor cells C11 to Cnn such that the oscillator 120 outputs a signal having the target frequency.

Further, the control logic circuit 110 may generate an output code OC corresponding to the generated input code IC.

For example, the control logic circuit 110 may include a dithering circuit 152 dithering the input code IC to generate a dithering signal DS.

According to some example embodiments, the dithering circuit 152 may include a delta-sigma modulator (DSM) 154. For example, the dithering circuit 152 may include a delta-sigma modulator 154 dithering a fractional value of the input code IC.

The dithering circuit 152 may output a dithering signal DS by adding a signal, dithered by the delta-sigma modulator 154, to an integer bit of the input code IC.

The control logic circuit 110 may include a decoder 153 decoding the dithering signal DS to generate an output code OC corresponding to the input code IC.

According to some example embodiments, the decoder 153 may decode the dithering signal DS to generate an output code OC corresponding to the input code IC.

For example, the decoder 153 may decode the dithering signal DS to generate an output code OC corresponding to the input code IC when the input code IC is within a desired (and/or alternatively predetermined) range.

For example, the decoder 153 may generate an output code "2" corresponding to an input code "256" in response to the input code "256" being generated within a desired (and/or alternatively predetermined) range of "255" to "767."

For example, at least a portion of an input code IC output through the comparator 151 and an output code OC generated by the decoder 153 may be referred to as a thermometer code.

Further, the control logic circuit 110 may control at least two of the capacitor cells C11 to Cnn based on the output code OC generated by the decoder 153.

According to some example embodiments, the control logic circuit 110 may ground at least two of the capacitor cells C11 to Cnn based on the output code OC.

For example, the control logic circuit 110 may ground a 1-1-th capacitor cell C11 and a 2-1-th capacitor cell C21 based on an output code "2" corresponding to the input code "256."

According to some example embodiments, the control logic circuit 110 may connect at least two of the selected capacitor cells C11 to Cnn to a power supply voltage based on the output code OC.

For example, the control logic circuit 110 may connect the 1-1-th capacitor cell C11 and the 2-1-th capacitor cell C21 to the power supply voltage based on the output code "2" corresponding to the input code "256."

The oscillator 120 may output an output signal OS through an electrical path including at least a portion of the capacitor cells.

For example, the oscillator 120 may output a second signal through an electrical path including capacitor cells other than the capacitor cells grounded by the control logic circuit 110.

The oscillator 120 may output a second signal through an electrical path including capacitor cells connected to the power supply voltage by the control logic circuit 110.

The second signal may be understood as having a second frequency, different from the first frequency of the first signal.

Through the above-described configurations, the control logic circuit 110 may control an electrical path through which the output signal is generated by the oscillator 120. The control logic circuit 110 may control a frequency (or a phase) of the output signal OS output from the oscillator (120).

Referring to the above-described configurations, the control logic circuit 110 may generate an output code OC for controlling at least two capacitor cells, corresponding to each of the input code IC generated based on the result of the comparison between the frequency of the output signal OS and the target frequency.

Further, the control logic circuit 110 may control at least two capacitor cells based on the output code OC such that the oscillator 120 outputs a signal having the target frequency.

For example, the control logic circuit 110 may control at least two capacitor cells through a single operation of comparing the frequency of the signal, output from the oscillator 120, and the target frequency.

The control logic circuit 110 may control at least two capacitor cells to control a frequency (or a phase) of the output signal OS output from the oscillator 120.

As a result, the phase-locked loop circuit 100 according to some example embodiments may reduce the time required for the oscillator 120 to output a signal having a target frequency.

Figure 2A:
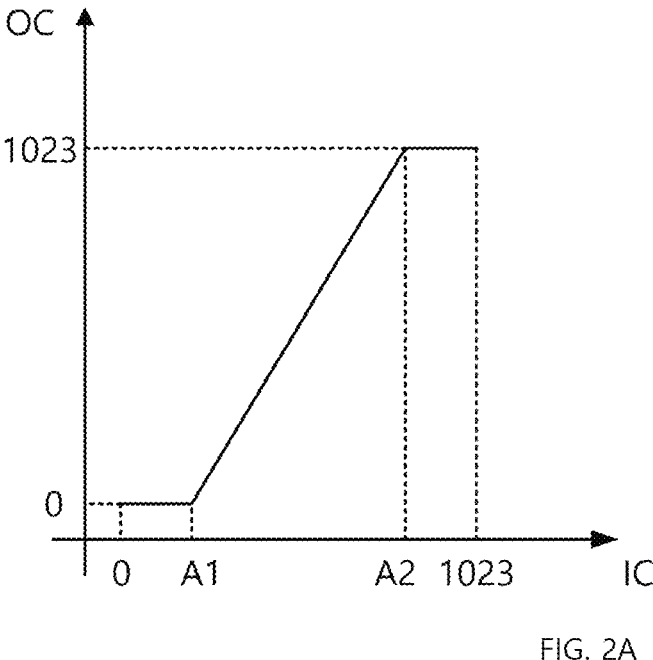
FIG. 2A is a diagram illustrating an output code corresponding to an input code according to some example embodiments.
Figure 2B:
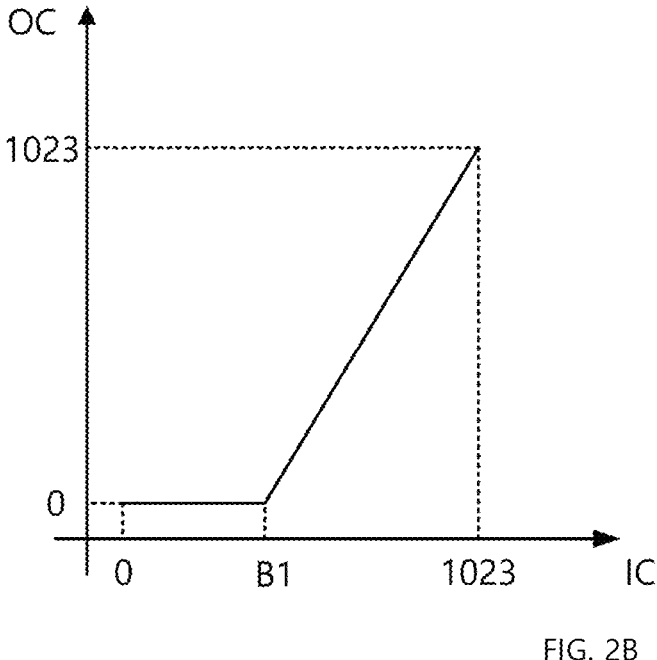
FIG. 2B is a diagram illustrating an output code corresponding to an input code according to some example embodiments.
Figure 2C:
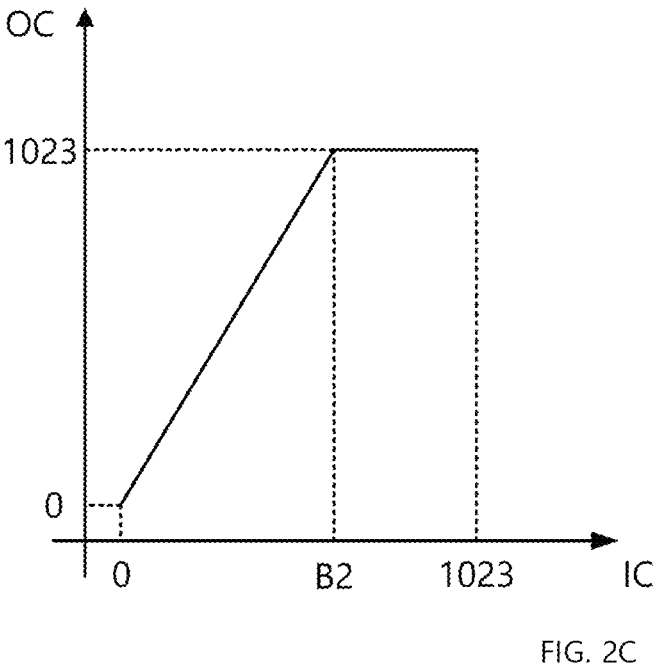
FIG. 2C is a diagram illustrating an output code corresponding to an input code according to some example embodiments.

FIG. 2A is a diagram illustrating an output code corresponding to an input code according to some example embodiments. FIG. 2B is a diagram illustrating an output code corresponding to an input code according to some example embodiments. FIG. 2C is a diagram illustrating an output code corresponding to an input code according to some example embodiments.

Referring to FIGS. 2A to 2C, the control logic circuit 110 may generate an output code OC corresponding to each of the input codes IC generated based on the frequency of the output signal OS output from the oscillator 120.

For example, the control logic circuit 110 may generate an output code OC corresponding to each of the input codes IC generated based on the comparison result of the frequency of the output signal OS and the target frequency through the comparator 151.

Referring to FIG. 1B and FIG. 2A, the control logic circuit 110 or the comparator 151 may generate an input code, among a number of input codes corresponding to the number of a plurality of capacitor cells C11 to Cnn.

For example, the control logic circuit 110 may generate one of the input codes "0" to "1023" based on the result of the comparison between the frequency of the output signal OS and the target frequency.

The control logic circuit 110 may generate an output code OC corresponding to the generated input code IC, among a number of output codes corresponding to the number of a plurality of capacitor cells C11 to Cnn.

For example, the control logic circuit 110 may generate an output code OC corresponding to the generated input code IC, among the output codes "0" to "1023."

However, the configurations of the drawings and the above descriptions regarding the number of input codes IC and/or the output codes OC are examples, and the number of input codes IC and/or the output codes OC are not limited thereto.

Each of the plurality of input codes corresponding to the plurality of output codes may be understood as a digital code for controlling or selecting each of the plurality of capacitor cells C11 to Cnn included in the oscillator 120.

Accordingly, the plurality of input codes and/or the plurality of output codes may be referred to as, for example, a thermometer code.

Referring to FIG. 2A according to some example embodiments, the control logic circuit 110 may generate an output code OC corresponding to an input code IC when the generated input code IC is within a desired (and/or alternatively predetermined) range.

For example, the control logic circuit 110 may generate an output code OC corresponding to the input code IC within the desired (and/or alternatively predetermined) range, among the generated input codes.

The control logic circuit 110 may generate an output code OC corresponding to an input code IC between a desired (and/or alternatively predetermined) first boundary code A1 and a desired (and/or alternatively predetermined) second boundary code A2 when the input code IC is generated.

For example, the range set for the input code IC may be set for the number, size, or identifier of each input code, but some example embodiments are not limited thereto.

For example, the control logic circuit 110 may generate an output code "2" corresponding to the generated input code IC in response to an input code "256," falling within a desired (and/or alternatively predetermined) range of "255" to "767," being generated.

For example, the control logic circuit 110 may generate an output code "4" corresponding to the generated input code IC in response to an input code "257," falling within a desired (and/or alternatively predetermined) range of "255" to "767," being generated.

On the other hand, the control logic circuit 110 may generate a desired (and/or alternatively predetermined) output code OC when the generated input code is outside a desired (and/or alternatively predetermined) range.

For example, the control logic circuit 110 may generate an output code OC corresponding to the first boundary code A1 in response to an input code, less than the first boundary code A1, being generated.

The control logic circuit 110 may generate an output code OC corresponding to the second boundary code A2 in response to an input code, greater than the second boundary code A2, being generated.

For example, the control logic circuit 110 may generate an output code "0" corresponding to the input code "255" when an input code of "200" is generated outside the desired (and/or alternatively predetermined) range of "255" to "767."

The control logic circuit 110 may generate an output code "1023" corresponding to the input code "767" when an input code of "1000" is generated outside the desired (and/or alternatively predetermined) range of "255" to "767."

However, the above descriptions regarding the first boundary code A1 and the second boundary code A2 are merely examples, and some example embodiments are not limited thereto.

Referring to FIG. 2B, according to some example embodiments, the control logic circuit 110 may generate an output code OC corresponding to the generated input code IC when the input code IC is greater than a desired (and/or alternatively predetermined) first reference code B1.

For example, the control logic circuit 110 may generate an output code "2" corresponding to the generated input code IC in response to an input code "513," greater than the desired (and/or alternatively predetermined) first reference code B1 of "512," being generated.

For example, the control logic circuit 110 may generate an output code "4" corresponding to the generated input code IC in response to an input code "514," greater than the desired (and/or alternatively predetermined) first reference code B1 of "512," being generated.

The control logic circuit 110 may generate an output code "0" corresponding to the first reference code B1 of "512" in response to an input code "511," less than the first reference code B1 of "512," being generated.

Referring to FIG. 2C, according to some example embodiments, the control logic circuit 110 may generate an output code OC corresponding to an input code when the input code is less than a desired (and/or alternatively predetermined) second reference code B2.

For example, the control logic circuit 110 may generate an output code "1021" corresponding to the generated input code IC in response to an input code "511," less than the second reference code B2 of "512," being generated.

For example, the control logic circuit 110 may generate an output code "1019" corresponding to the generated input code IC in response to an input code "510," less than the second reference code B2 of "512," being generated.

The control logic circuit 110 may generate an output code "1023" corresponding to the second reference code B2 of "512" in response to an input code "522," greater than the second reference code B2 of "512," being generated.

However, the above descriptions of the first reference code B1 and/or the second reference code B2 are merely examples, and some example embodiments are not limited thereto.

The descriptions of the operation of generating an output code OC corresponding to an input code are merely examples depending on whether the input code generated by the control logic circuit 110 is within a desired (and/or alternatively predetermined) range, and some example embodiments are not limited thereto.

Referring to the above-described configurations, the control logic circuit 110 according to some example embodiments may generate output codes OC, each having a difference of at least "2," to correspond to each of the input codes IC that are different within a desired (and/or alternatively predetermined) range.

The control logic circuit 110 according to some example embodiments may generate a specified output code OC for an input code IC outside the desired (and/or alternatively predetermined) range.

For example, the control logic circuit 110 may generate an output code OC for controlling at least two capacitor cells, for each input code IC within a desired (and/or alternatively predetermined) range.

Furthermore, the control logic circuit 110 may control at least two capacitor cells based on an output code OC generated for each input code IC within a desired (and/or alternatively predetermined) range.

Accordingly, the control logic circuit 110 may control at least two capacitor cells corresponding to an input code IC generated through a single operation of comparing a frequency of the output signal OS with a target frequency.

As a result, the phase-locked loop circuit 100 according to some example embodiments may reduce the time required to control a plurality of capacitor cells C11 to Cnn such that the oscillator 120 is controlled to output a signal having the target frequency.

Figure 3:
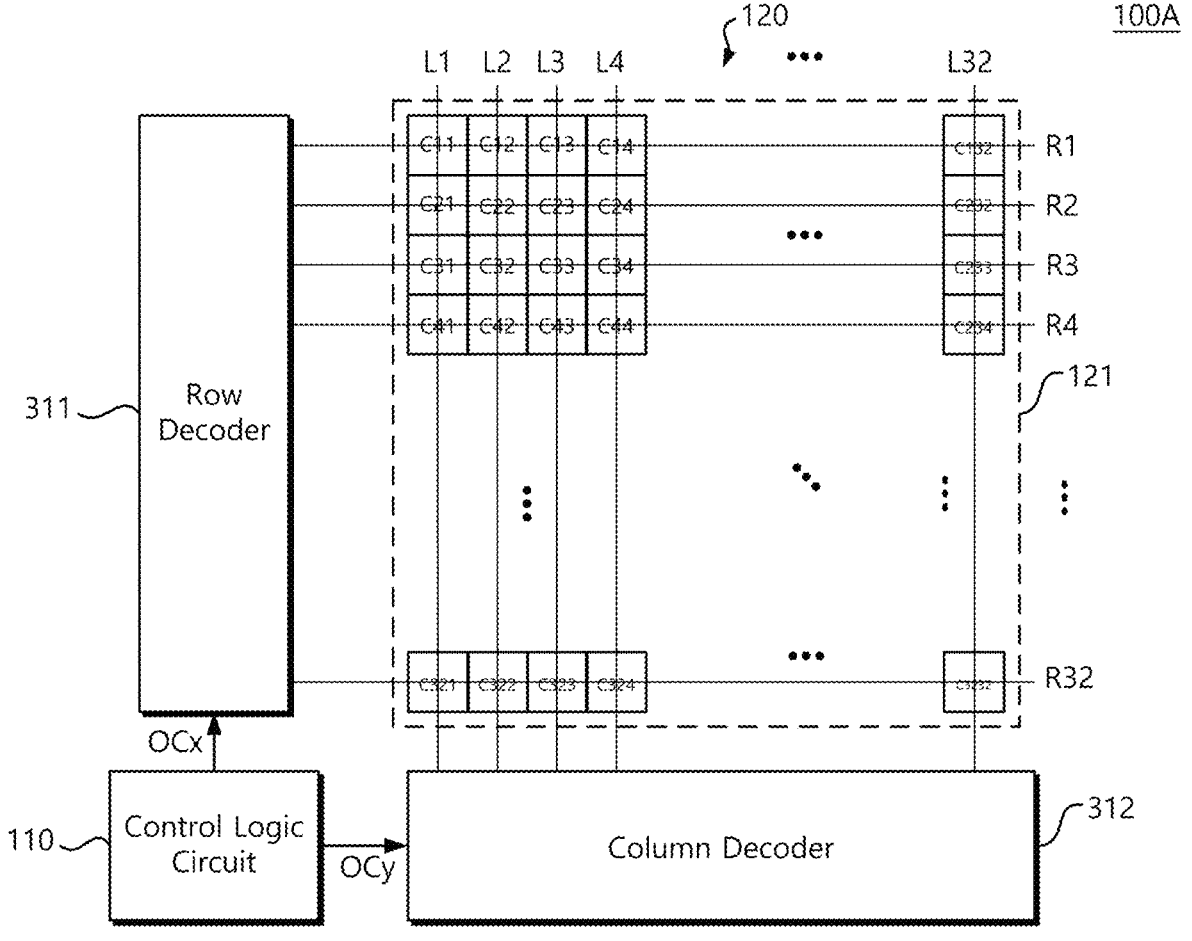
FIG. 3 is a diagram illustrating a phase-locked loop circuit including a capacitor cell array according to some example embodiments.
Figure 4A:
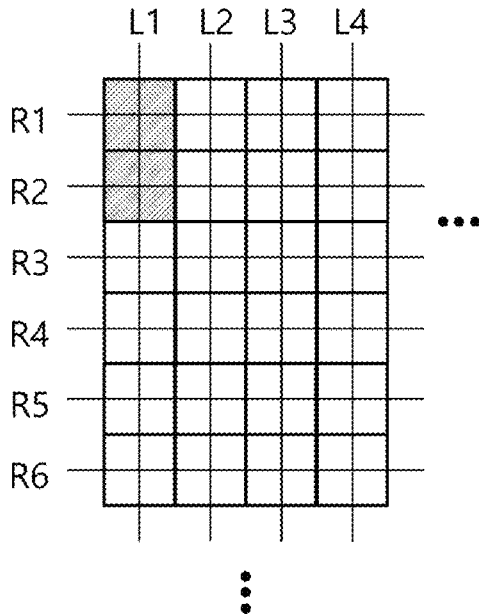
FIG. 4A is a diagram illustrating a configuration in which a control logic circuit according to some example embodiments grounds at least two capacitor cells based on an output code.
Figure 4B:
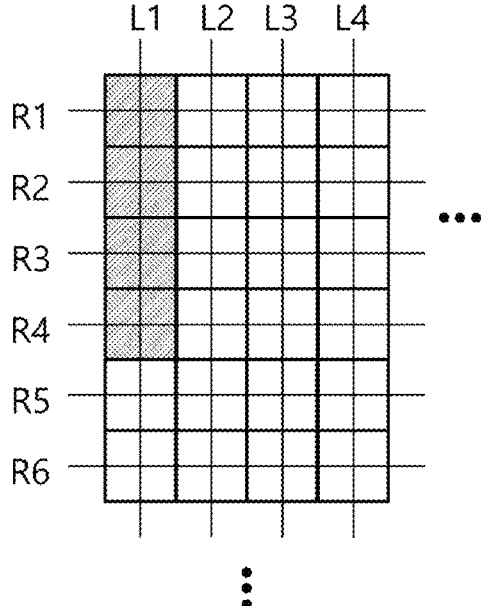
FIG. 4B is a diagram illustrating a configuration in which a control logic circuit according to some example embodiments additionally grounds at least two capacitor cells in the configuration of FIG. 4A based on an output code.
Figure 4C:
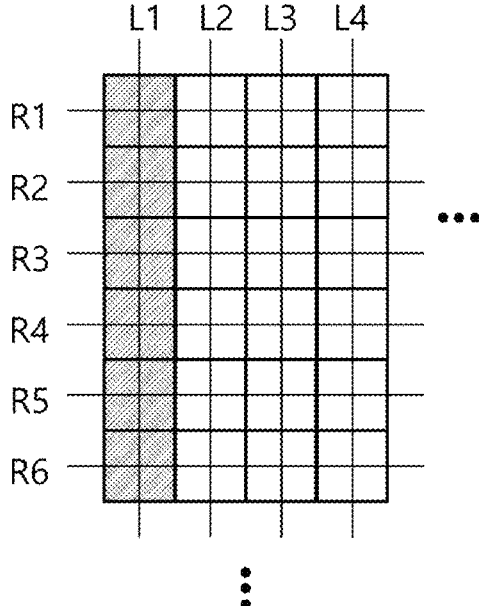
FIG. 4C is a diagram illustrating a configuration in which a control logic circuit according to some example embodiments additionally grounds at least two capacitor cells in the configuration of FIG. 4B based on an output code.

FIG. 3 is a diagram illustrating a phase-locked loop circuit including a capacitor cell array according to some example embodiments. FIG. 4A is a diagram illustrating a configuration in which a control logic circuit according to some example embodiments grounds at least two capacitor cells based on an output code. FIG. 4B is a diagram illustrating a configuration in which a control logic circuit according to an Some example embodiments additionally grounds at least two capacitor cells in the configuration of FIG. 4A based on an output code. FIG. 4C is a diagram illustrating a configuration in which a control logic circuit according to some example embodiments additionally grounds at least two capacitor cells in the configuration of FIG. 4B based on an output code.

Referring to FIG. 3, a phase-locked loop circuit 100A according to some example embodiments may include a control logic circuit 110, an oscillator 120, a row decoder 311, and a column decoder 312.

The phase-locked loop circuit 100A illustrated in FIG. 3 may be understood as an example of the phase-locked loop circuit 100 illustrated in FIG. 1A. Therefore, the same or substantially the same components are represented by the same reference numbers, and redundant descriptions will be omitted.

The control logic circuit 110 may generate an output code OC to select at least a portion of the plurality of capacitor cells C11 to C3232 corresponding to the input code generated based on a result of comparison between the frequency of the output signal OS and the target frequency.

For example, the control logic circuit 110 may generate an output code OC to select at least two capacitor cells, among a plurality of capacitor cells C11 to Cnn corresponding to the input code within a desired (and/or alternatively predetermined) range.

The phase-locked loop circuit 100A may include a plurality of row control lines R1 to R32 connected to the plurality of capacitor cells C11 to Cnn. The phase-locked loop circuit 100A may include a plurality of column control lines L1 to L32 connected to the plurality of capacitor cells C11 to Cnn.

The plurality of capacitor cells C11 to Cnn may be arranged to be connected to a plurality of row control lines R1 to R32 and the plurality of column control lines L1 to L32.

The phase-locked loop circuit 100A may include a row decoder 311 connected to the plurality of row control lines R1 to R32.

According to some example embodiments, the row decoder 311 may select at least a portion of the plurality of row control lines R1 to R32.

For example, the row decoder 311 may decode the output code OC, transmitted from the control logic circuit 110, to select at least a portion of the plurality of row control lines R1 to R32.

The output code OC may include a row component OCx to select at least a portion of the plurality of row control lines R1 to R32.

Accordingly, the row decoder 311 may decode the row component OCx of the output code OC, transmitted from the control logic circuit 110, to select at least a portion of the plurality of row control lines R1 to R32.

The phase-locked loop circuit 100A may include a column decoder 312 connected to the plurality of column control lines L1 to L32.

For example, the column decoder 312 may decode the output code OC, transmitted from the control logic circuit 110, to select at least a portion of the plurality of column control lines L1 to L32.

The output code OC may include a column component OCy to select at least a portion of the plurality of column control lines L1 to L32.

Accordingly, the column decoder 312 may decode the column component OCy of the output code OC, transmitted from the control logic circuit 110, to select at least a portion of the plurality of column control lines L1 to L32.

Furthermore, the control logic circuit 110 may control the capacitor cells selected by the row decoder 311 and the column decoder 312.

According to some example embodiments, the control logic circuit 110 may ground the capacitor cells selected by the row decoder 311 and the column decoder 312. According to some example embodiments, the control logic circuit 110 may connect the capacitor cells, selected by the row decoder 311 and the column decoder 312, to a power supply voltage.

Referring to FIGS. 4A to 4C, the control logic circuit 110 according to some example embodiments may select and control at least two capacitor cells based on an output code OC corresponding to an input code IC.

An example is provided in which input codes IC generated in FIGS. 4A to 4C are all input codes IC within a desired (and/or alternatively predetermined) range.

For example, referring to FIG. 4A, the control logic circuit 110 may select a 1-1-th capacitor cell C11 and a 2-1-th capacitor cell C21 through a first row control line R1 and a second row control line R2 and a column control line L1 based on an output code "2" corresponding to an input code "256."

The control logic circuit 110 according to some example embodiments may ground the selected 1-1-th and 2-1-th ground capacitor cells C11 and C21.

Furthermore, the control logic circuit 110 may generate input code "257" when a difference between the frequency of the output signal OS and the target frequency is greater than a desired (and/or alternatively predetermined) difference in a state in which when the 1-1-th and 2-1-th capacitor cells C11 and C21 are grounded.

The control logic circuit 110 may generate an output code "4" corresponding to the input code "257."

Referring to FIG. 4B, the control logic circuit 110 may select a 3-1-th capacitor cell C31 and a 4-1-th capacitor cell C41 through a third row control line R3, a fourth row control line R4, and a column control line L1 based on the output code "4" corresponding to the input code "257."

The control logic circuit 110 may ground the 3-1-th and 4-1-th capacitor cells C31 and C41.

Furthermore, the control logic circuit 110 may generate an input code "258" when a difference between the frequency of the output signal OS and the target frequency is greater than a desired (and/or alternatively predetermined) difference in a state in which the 1-1-th to 4-1-th capacitor cells C11 to C41 are grounded.

The control logic circuit 110 may generate an output code "6" corresponding to the input code "258."

Referring to FIG. 4C, the control logic circuit 110 may select a 5-1-th capacitor cell C51 and a 6-1-th capacitor cell C61 through a fifth row control line R5, a sixth row control line R6, and a column control line L1 based on the output code "6" corresponding to the input code "258."

The control logic circuit 110 according to some example embodiments may a 5-1-th capacitor cell C51 and a 6-1-th capacitor cell C61.

Referring to the above-described configurations, the control logic circuit 110 may generate output codes OC having a difference of at least "2" to correspond to different input codes IC generated within a desired (and/or alternatively predetermined) range based on a result of comparing the frequency of the output signal OS and the target frequency.

For example, the control logic circuit 110 may generate an output code OC to select at least two capacitor cells to correspond to each input code IC within a desired (and/or alternatively predetermined) range.

Furthermore, the control logic circuit 110 may control at least two capacitor cells selected by the row decoder 311 and the column decoder 312 based on the output code OC.

Accordingly, the control logic circuit 110 may control at least two capacitor cells to correspond to the input code IC generated by comparing the frequency of the output signal OS and the target frequency through a single operation.

As a result, the phase-locked loop circuit 100A according to an Some example embodiments may reduce the time required to control the plurality of capacitor cells C11 to C3232 such that the oscillator 120 is controlled to output a signal having the target frequency.

Figure 5A:
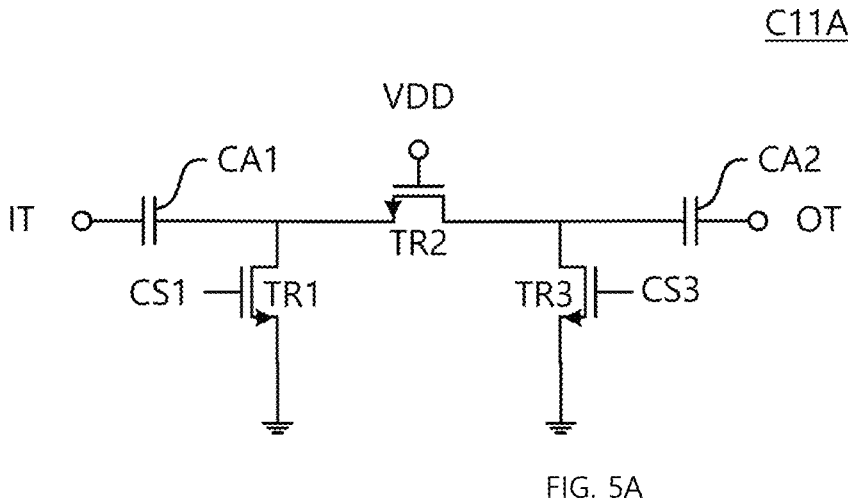
FIG. 5A is a circuit diagram illustrating a configuration of a 1-1-th capacitor cell according to some example embodiments.
Figure 5B:
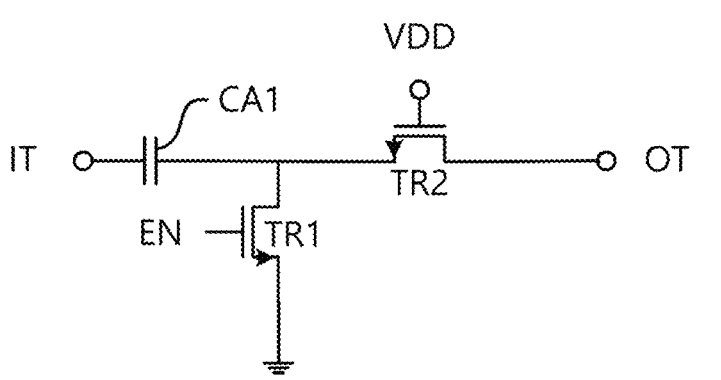
FIG. 5B is a circuit diagram illustrating a configuration of a 1-1-th capacitor cell according to some example embodiments.

FIG. 5A is a circuit diagram illustrating a configuration of a 1-1-th capacitor cell according to some example embodiments. FIG. 5B is a circuit diagram illustrating another configuration of a 1-1-th capacitor cell according to some example embodiments.

Referring to FIGS. 5A and 5B, a 1-1-th capacitor cell C11 according to some example embodiments may include a plurality of transistors TR1 and TR2 or TR3, and at least one capacitor CA1 or CA2.

For example, referring to FIG. 5A according to some example embodiments, a 1-1-th capacitor cell C11A may include a first transistor TR1, a second transistor TR2, a third transistor TR3, a first capacitor CA1, and a second capacitor CA2.

The 1-1-th capacitor cell C11A may be referred to as an example of a capacitor cell connected to a first row control line R1 and a first column control line L1 of FIG. 3.

The 1-1-th capacitor cell C11A may include a first transistor TR1 and a third transistor TR3, each connected to a ground.

The 1-1-th capacitor cell C11A may include a second transistor TR2 that may be connected to a power voltage. The second transistor TR2 may be connected between the first transistor TR1 and the third transistor TR3.

The 1-1-th capacitor cell C11A may include a first capacitor CA1 and a second capacitor CA2 connected in series.

For example, the 1-1-th capacitor cell C11A may include a first capacitor CA1 connected to an input terminal IT. The 1-1-th capacitor cell C11A may include a second capacitor CA2 connected to an output terminal OT.

Referring to FIGS. 3, 4A, 4B, 4C, and 5A, a control logic circuit 110 may control at least a portion of the transistors TR1, TR2, and TR3 included in the 1-1-th capacitor cell C11A.

According to some example embodiments, the control logic circuit 110 may turn on the first transistor TR1 and the third transistor TR3 in response to the 1-1-th capacitor cell C11A being selected by the row decoder 311 and the column decoder 312.

For example, the control logic circuit 110 may provide a high-level first signal CS1 to the first transistor TR1 in response to the 1-1-th capacitor cell C11A being selected by the row decoder 311 and the column decoder 312. The control logic circuit 110 may provide a high-level third signal CS3 to the third transistor TR3.

The control logic circuit 110 may turn off the second transistor TR2. For example, the control logic circuit 110 may provide a low-level second signal CS2 (not shown) to the second transistor TR2.

As a result, the control logic circuit 110 may ground the first capacitor CA1 and the second capacitor CA2 of the 1-1-th capacitor cell C11A. A state, in which the first capacitor CA1 and the second capacitor CA2 are grounded, may be referred to as a state in which the 1-1-th capacitor cell C11A is deactivated (or grounded).

According to some example embodiments, the control logic circuit 110 may turn off the first transistor TR1 and the third transistor TR3 in response to the 1-1-th capacitor cell C11A being selected by the row decoder 311 and the column decoder 312.

The control logic circuit 110 may turn on the second transistor TR2.

As a result, the control logic circuit 110 may connect the first capacitor CA1 and the second capacitor CA2. The first capacitor CA1 and the second capacitor CA2 may be connected to a power supply voltage.

A state, in which the input terminal IT and the output terminal OT are connected through the first capacitor CA1 and the second capacitor CA2, may be referred to as a state in which the 1-1-th capacitor cell C11A is activated (or turned on).

Each of the plurality of capacitor cells C11 to C3232, included in the oscillator 120, may be referred to as having substantially a same structure as the 1-1-th capacitor cell C11A.

Referring to FIG. 5B according to some example embodiments, a 1-1-th capacitor cell C11B may include a first transistor TR1, a second transistor TR2, and a first capacitor CA1.

The 1-1-th capacitor cell C11B may be referred to as an example of a capacitor cell connected to the first row control line R1 and the first column control line L1 of FIG. 3.

The 1-1-th capacitor cell C11B may include a first transistor TR1 connected to a ground.

The 1-1-th capacitor cell C11B may include a second transistor TR2 connected to a power supply voltage VDD.

The 1-1-th capacitor cell C11B may include a first capacitor CA1 connected to the input terminal IT.

Referring to FIGS. 3, 4A, 4B, 4C, and 5B, the control logic circuit 110 may control at least a portion of the transistors TR1 and TR2 included in the 1-1-th capacitor cell C11B.

According to some example embodiments, the control logic circuit 110 may turn on the first transistor TR1 in response to the 1-1-th capacitor cell C11B being selected by the row decoder 311 and the column decoder 312.

For example, the control logic circuit 110 may provide a high-level first signal EN to the first transistor TR1 in response to the 1-1-th capacitor cell C11B being selected by the row decoder 311 and the column decoder 312.

The control logic circuit 110 may turn off the second transistor TR2. For example, the control logic circuit 110 may provide a low-level second signal CS2 (not shown) to the second transistor TR2.

As a result, the control logic circuit 110 may ground the first capacitor CA1 of the 1-1-th capacitor cell C11B. A state, in which the first capacitor CA1 is grounded, may be referred to as a state in which the 1-1-th capacitor cell C11B is deactivated (or grounded).

According to some example embodiments, the control logic circuit 110 may turn off the first transistor TR1 in response to the 1-1-th capacitor cell C11B being selected by the row decoder 311 and the column decoder 312.

The control logic circuit 110 may turn on the second transistor TR2.

As a result, the control logic circuit 110 may connect the input terminal IT and the output terminal OT through the first capacitor CA1. The first capacitor CA1 may be connected to a power supply voltage.

A state, in which the input terminal IT and the output terminal OT are connected through the first capacitor CA1, may be referred to as a state in which the 1-1-th capacitor cell C11B is activated (or turned on).

According to some example embodiments, the oscillator 120 may output an output signal OS through an electrical path including capacitor cells C11 to C3232 other than grounded capacitor cells.

Accordingly, the control logic circuit 110 may control at least a portion of the capacitor cells C11 to C3232 to control the frequency of the output signal OS generated by the oscillator 120.

For example, the control logic circuit 110 may control at least two capacitor cells to increase a frequency control range depending on the input code IC, based on the output code OC corresponding to the input code IC within a desired (and/or alternatively predetermined) range.

As a result, the phase-locked loop circuit 100 according to some example embodiments may reduce the time required for the oscillator 120 to output a signal having a target frequency.

Figure 6A:
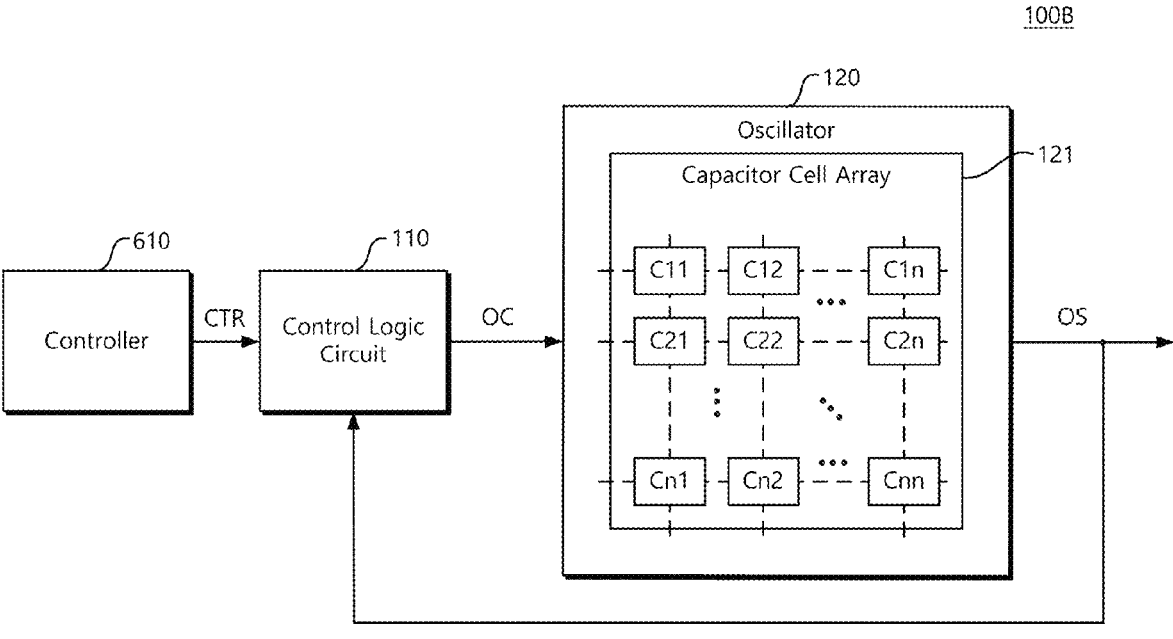
FIG. 6A is a block diagram illustrating a phase-locked loop circuit further including a controller according to some example embodiments.
Figure 6B:
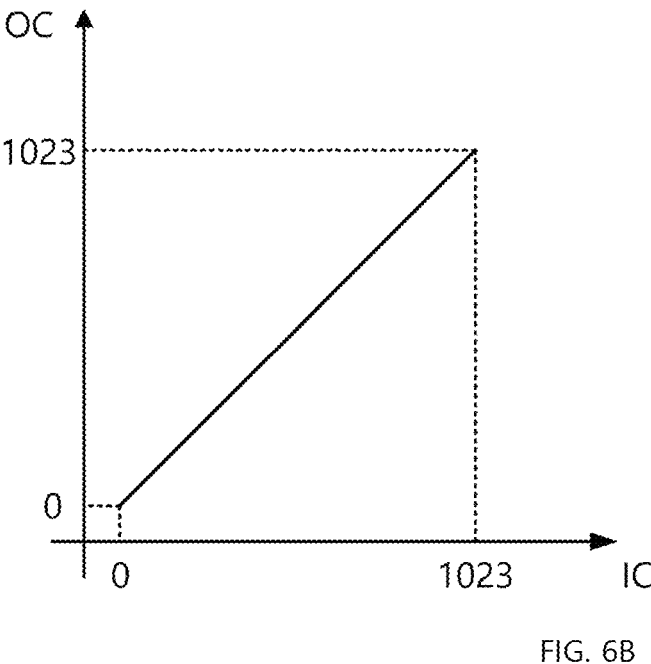
FIG. 6B is a diagram illustrating an output code corresponding to an input code in a second mode of FIG. 6A.
Figure 6C:
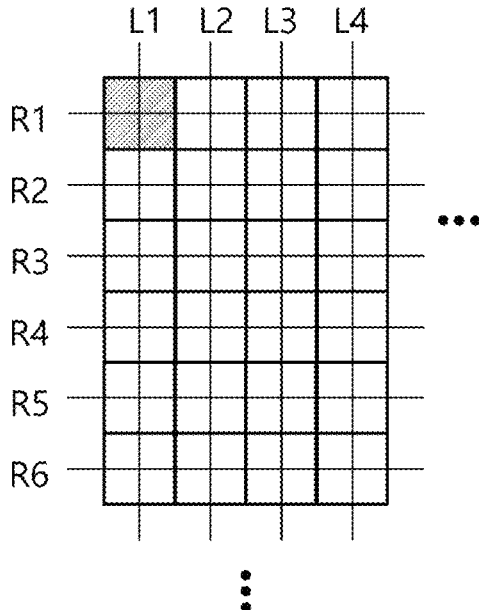
FIG. 6C is a diagram illustrating a configuration in which a control logic circuit grounds a single capacitor cell based on an output code in the second mode of FIG. 6A.
Figure 6D:
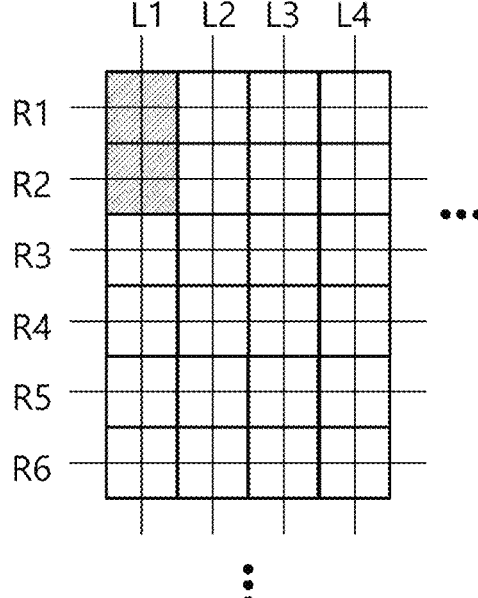
FIG. 6D is a diagram illustrating a configuration in which a control logic circuit additionally grounds a single capacitor cell in the configuration of FIG. 6C based on the output code in the second mode of FIG. 6A.
Figure 6E:
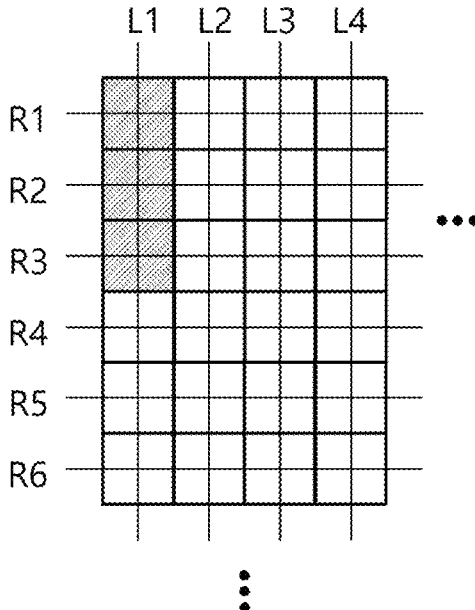
FIG. 6E is a diagram illustrating a configuration in which a control logic circuit additionally grounds a single capacitor cell in the configuration of FIG. 6D based on the output code in the second mode of FIG. 6A.

FIG. 6A is a block diagram illustrating a phase-locked loop circuit further including a controller according to some example embodiments. FIG. 6B is a diagram illustrating an output code corresponding to an input code in a second mode of FIG. 6A. FIG. 6C is a diagram illustrating a configuration in which a control logic circuit grounds a single capacitor cell based on an output code in the second mode of FIG. 6A. FIG. 6D is a diagram illustrating a configuration in which a control logic circuit additionally grounds a single capacitor cell in the configuration of FIG. 6C based on the output code in the second mode of FIG. 6A. FIG. 6E is a diagram illustrating a configuration in which a control logic circuit additionally grounds a single capacitor cell in the configuration of FIG. 6D based on the output code in the second mode of FIG. 6A.

Referring to FIG. 6A, phase-locked loop circuit 100B according to some example embodiments may include a control logic circuit 110, an oscillator 120, and a controller 610.

The phase-locked loop circuit 100B illustrated in FIG. 6A may be understood as an example of the phase-locked loop circuit 100 illustrated in FIG. 1A. Therefore, the same or substantially the same components are represented by the same reference numbers, and redundant descriptions will be omitted.

According to some example embodiments, the phase-locked loop circuit 100B may further include a controller 610 connected to the control logic circuit 110.

The controller 610 according to some example embodiments may be configured to control the control logic circuit 110 and/or the oscillator 120.

The controller 610 may provide a control signal CTR to the control logic circuit 110 and receive data from the control logic circuit 110. The controller 610 may be configured to execute firmware to control the control logic circuit 110.

For example, the controller 610 may control the control logic circuit 110 to operate in different modes depending on the magnitude of a target frequency.

For example, the controller 610 may generate a control signal to control the control logic circuit 110 based on a result of comparison between a target frequency and a reference frequency.

The reference frequency may be understood as a desired (and/or alternatively predetermined) frequency for the controller 610 to control the control logic circuit 110 to operate in different modes depending on the magnitude of the target frequency.

In some example embodiments, when the target frequency is less than a desired (and/or alternatively predetermined) reference frequency, the controller 610 may control the control logic circuit 110 to operate in a first mode in which the control logic circuit 110 controls at least two capacitor cells for each input code.

For example, when the target frequency is less than the reference frequency, the controller 610 may generate a first control signal controlling the control logic circuit 110 to output an output code for controlling at least two capacitor cells for each input code.

For example, when the target frequency is less than the desired (and/or alternatively predetermined) reference frequency, the controller 610 may generate a first control signal controlling the control logic circuit 110 to generate an output code for controlling the first capacitor cell C11 and the second capacitor cell C21.

For example, the controller 610 may control the control logic circuit 110 to control at least two capacitor cells to correspond to each input code in a low band.

In some example embodiments, when the target frequency is greater than or equal to the desired (and/or alternatively predetermined) reference frequency, the controller 610 may control the control logic circuit 110 to operate in a second mode in which the control logic circuit 110 controls a single capacitor cell for each input code.

For example, when the target frequency is greater than or equal to a reference frequency, the controller 610 may generate a second control signal controlling the control logic circuit 110 to output an output code for controlling a single capacitor cell for each input code.

For example, when the target frequency is greater than or equal to a desired (and/or alternatively predetermined) reference frequency, the controller 610 may generate a second control signal controlling the control logic circuit 110 to generate an output code for controlling the second capacitor cell C21.

Furthermore, the controller 610 may transmit the generated control signal CTR to the control logic circuit 110. The control signal CTR may include the above-described first or second control signal.

For example, the controller 610 may transmit the generated first or second control signal to the control logic circuit 110 based on the magnitude of the target frequency.

The control logic circuit 110 may control a plurality of capacitor cells C11 to Cnn, included in the oscillator 120, based on the control signal received from the controller 610.

For example, the control logic circuit 110 may operate in a first mode in which at least two of the plurality of capacitor cells C11 to Cnn are controlled, or a second mode in which a single capacitor cell is controlled, based on the control signal.

The operation of the control logic circuit 110 in the first mode, in which at least two capacitor cells are controlled, based on the first control signal according to some example embodiments may be understood as substantially the same as the operation of the control logic circuit 110 described in FIGS. 3, 4A, 4B, and 4C.

Referring to FIG. 6B, when the control logic circuit 110 according to some example embodiments operates in the second mode, the control logic circuit 110 may generate an output code OC that corresponds to the generated input code IC, among the number of output codes corresponding to the number of the plurality of capacitor cells C11 to Cnn.

For example, the control logic circuit 110 may generate an output code OC, corresponding to the generated input code IC, among "0" to "1023." Each output code OC may respectively correspond to each input code IC.

Referring to FIGS. 6C to 6E, the control logic circuit 110 according to some example embodiments may select and control a single capacitor cell, based on the output code OC corresponding to the input code IC, in the second mode.

For example, referring to FIG. 6C, the control logic circuit 110 may select a 1-1-th capacitor cell C11 through a first row control line R1 and a first column control line L1 based on an output code "1" corresponding to an input code "1."

The control logic circuit 110 according to some example embodiments may ground the selected 1-1-th capacitor cell C11.

Furthermore, when a difference between a frequency of the output signal OS and a target frequency is greater than a desired (and/or alternatively predetermined) difference in a state in which the 1-1-th capacitor cell C11 is grounded, the control logic circuit 110 may generate an input code "2."

The control logic circuit 110 may generate an output code "2" corresponding to the input code "2."

Referring to FIG. 6D, the control logic circuit 110 may select a 2-1-th capacitor cell C21 through a second row control line R2 and the first column control line L1 based on an output code "2" corresponding to the input code "2."

The control logic circuit 110 according to some example embodiments may ground the selected 2-1-th capacitor cell C21.

Furthermore, when the difference between the frequency of the output signal OS and the target frequency is greater than the desired (and/or alternatively predetermined) difference in a state in which the 1-1-th capacitor cell C11 and the 2-1-th capacitor cell C21 are grounded, the control logic circuit 110 may generate an input code "3."

The control logic circuit 110 may generate an output code "3" corresponding to the input code "3."

Referring to FIG. 6E, the control logic circuit 110 may select a 3-1-th capacitor cell C31 through a third row control line R3 and the first column control line L1 based on the output code "3" corresponding to the input code "3."

The control logic circuit 110 according to some example embodiments may ground the selected 3-1-th capacitor cell C31.

Referring to the above-described configurations, the control logic circuit 110 may generate output codes OCs, each having a difference of "1," to correspond to different input codes ICs generated in the second mode.

Referring to the above-described configurations, the control logic circuit 110 may generate an output code OC for controlling at least two capacitor cells when the target frequency is less than the desired (and/or alternatively predetermined) reference frequency.

For example, when the target frequency is in a relatively low band, the control logic circuit 110 may control at least two capacitor cells to correspond to each input code in a specified range.

On the other hand, the control logic circuit 110 may generate an output code OC for controlling a single capacitor cell when the target frequency is greater than or equal to the desired (and/or alternatively predetermined) reference frequency.

For example, when the target frequency is in a relatively high band, the control logic circuit 110 may control a single capacitor cell to correspond to each input code.

To summarize, the control logic circuit 110 may operate in different modes in which different numbers of capacitor cells are controlled to correspond to a single input code, depending on the magnitude of the target frequency.

This allows the phase-locked loop circuit 100B according to some example embodiments to reduce the time required for the oscillator 120 to output a signal having the target frequency in a state in which it has a relatively low target frequency.

The phase-locked loop circuit 100B according to some example embodiments may maintain and/or minimize the time required for the oscillator 120 to output a signal having the target frequency and a gain of the oscillator 120, regardless of the magnitude of the target frequency.

Figure 7:
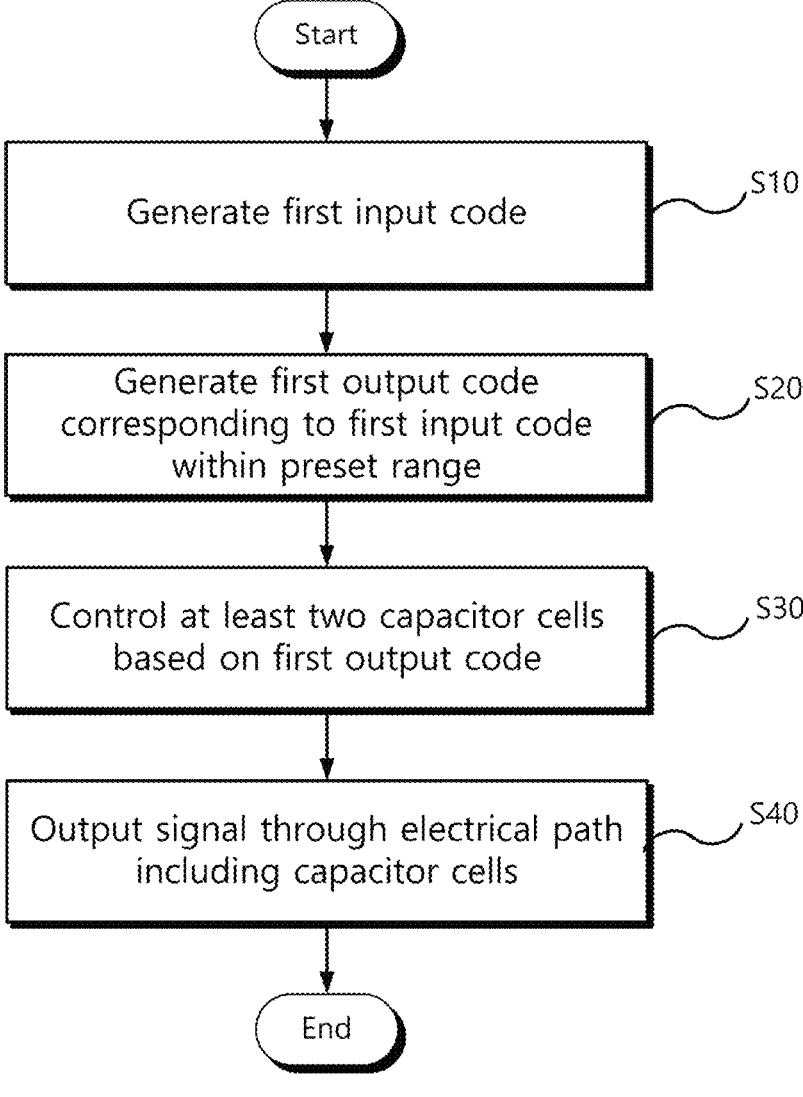
FIG. 7 is a flowchart illustrating a method, by which a control logic circuit controls at least two capacitor cells included in an oscillator, according to some example embodiments.

FIG. 7 is a flowchart illustrating a method, by which a control logic circuit controls at least two capacitor cells included in an oscillator, according to some example embodiments.

Referring to FIG. 7, a control logic circuit 110 (or, a phase-locked loop circuit 100) according to some example embodiments may control at least two capacitor cells, included in an oscillator 120, such that the oscillator 120 outputs a signal having a target frequency.

In operation S10, the control logic circuit 110 may generate a first input code.

For example, the control logic circuit 110 may compare a first frequency of a first signal, output from the oscillator 120, with a target frequency to generate the first input code.

The control logic circuit 110 may compare the first frequency of the first signal, output from the oscillator 120, with the target frequency to generate the first input code for controlling at least a portion of a plurality of capacitor cells C11 to Cnn included in the oscillator 120.

For example, the control logic circuit 110 may generate a first input code for grounding at least a portion of the multiple capacitor cells C11 to Cnn, included in the oscillator 120, such that the oscillator 120 outputs a signal having a target frequency.

For example, the control logic circuit 110 may generate a first input code for connecting at least a portion of the plurality of capacitor cells C11 to Cnn, included in the oscillator 12, to a power supply voltage.

The first input code may be understood as a thermometer code.

In operation S20, the control logic circuit 110 may generate a first output code corresponding to a first input code within a desired (and/or alternatively predetermined) range.

For example, the control logic circuit 110 may generate a first output code corresponding to the input code when the generated first input code is within the desired (and/or alternatively predetermined) range.

For example, the control logic circuit 110 may generate a first output code "2" in response to a first input code "256," falling within a desired (and/or alternatively predetermined) range of "255" to "767," being generated.

For example, the control logic circuit 110 may generate a first output code "1021" in response to a first input code "511," less than a desired (and/or alternatively predetermined) boundary code "512," being generated.

The output code OC may be referred to as a digital code for selecting at least a portion of the plurality of capacitor cells C11 to Cnn.

On the other hand, when the first input code is outside the desired (and/or alternatively predetermined) range, the control logic circuit 110 may generate a desired (and/or alternatively predetermined) code as the first output code. However, this will be described in detail later with reference to FIG. 8.

In operation S30, the control logic circuit 110 may control at least two capacitor cells based on the first output code.

For example, the control logic circuit 110 may control at least two capacitor cells, among the plurality of capacitor cells C11 to Cnn, based on the first output code.

According to some example embodiments, the control logic circuit 110 may ground at least two capacitor cells, among the plurality of capacitor cells C11 to Cnn, based on the first output code.

For example, the control logic circuit 110 may ground at least two capacitor cells, among the plurality of capacitor cells C11 to Cnn selected based on the first output code.

For example, the control logic circuit 110 may ground a 1-1-th capacitor cell C11 and a 2-1-th capacitor cell C21 based on the first output code "2" corresponding to the first input code "256."

According to some example embodiments, the control logic circuit 110 may connect at least two capacitor cells, among the plurality of capacitor cells C11 to Cnn, to a power supply voltage based on the first output code.

For example, the control logic circuit 110 may connect at least two capacitor cells, among the plurality of capacitor cells C11 to Cnn selected based on the first output code, to the power supply voltage.

For example, the control logic circuit 110 may connect a 3-1-th capacitor cell C31 and a 4-1-th capacitor cell C41 to the power supply voltage based on the first output code "4" corresponding to the first input code "257."

Accordingly, the control logic circuit 110 may control an electrical path, through which the output signal OS is generated, in the oscillator 120. For example, the control logic circuit 110 may control a frequency (or a phase) of the output signal OS output from the oscillator 120 through the above-described configurations.

In operation S40, the control logic circuit 110 (or the oscillator 120) may output the output signal OS through an electrical path including capacitor cells.

For example, the oscillator 120 may output a second signal having a second frequency through an electrical path including capacitor cells, connected to the power supply voltage, among the plurality of capacitor cells C11 to Cnn.

The oscillator 120 may output a second signal having a second frequency through an electrical path including capacitor cells, other than the grounded capacitor cells, among the plurality of capacitor cells C11 to Cnn.

The second frequency may be understood as a frequency of a band, different from the first frequency. For example, the second frequency may be understood as a frequency of a band relatively close to the target frequency, compared to the first frequency, but some example embodiments are not limited thereto.

Referring to the above-described configurations, the control logic circuit 110 may generate a first input code based on a result of comparison between the first frequency of the first signal, output from the oscillator 120, and the target frequency.

The control logic circuit 110 may generate a first output code, which corresponds to the first input code and is used to control at least two capacitor cells, in response to the first input code being generated.

Further, the control logic circuit 110 may control at least two capacitor cells based on the first output code such that the oscillator 120 outputs a signal having a target frequency.

For example, the control logic circuit 110 may control at least two capacitor cells through a single operation of comparing the frequency of the signal, output from the oscillator 120, with the target frequency.

The control logic circuit 110 may control at least two capacitor cells to control a frequency (or a phase) of the signal output from the oscillator 120.

As a result, the phase-locked loop circuit 100 according to some example embodiments may reduce the time required for the oscillator 120 to output a signal having the target frequency.

Figure 8:
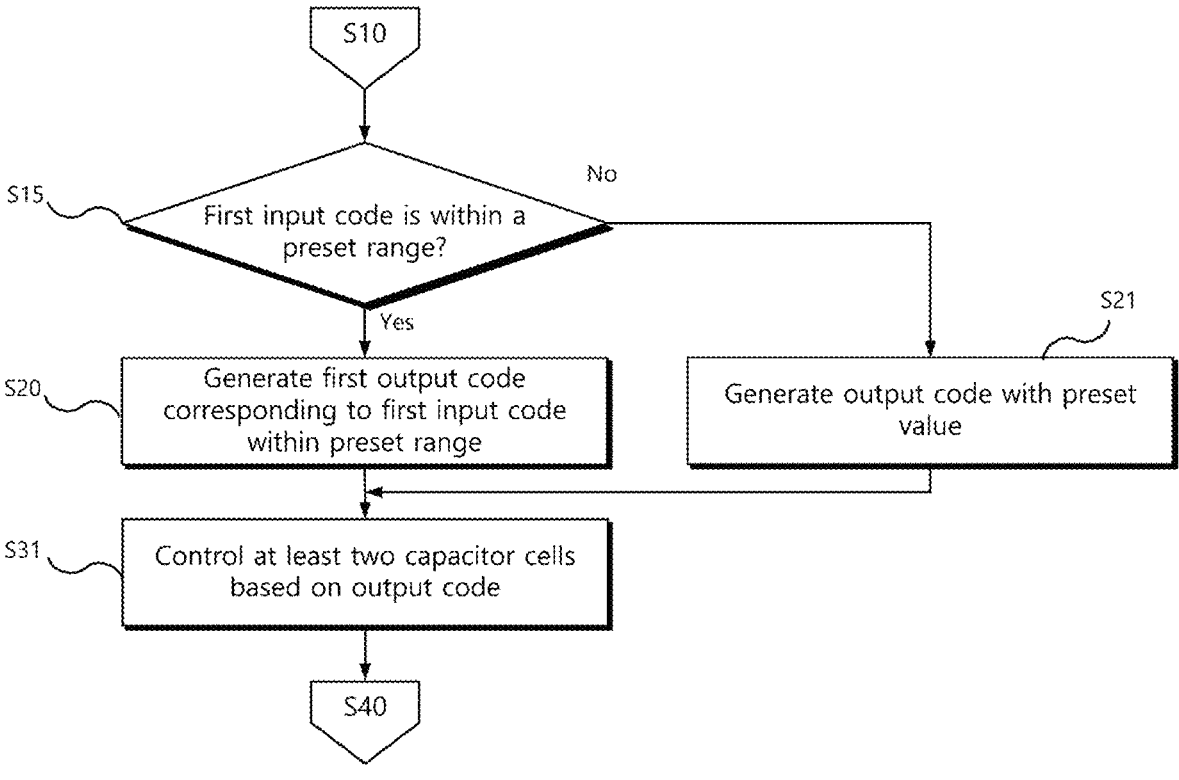
FIG. 8 is a flowchart illustrating a method of generating an output code based on whether a first input code is within a desired (and/or alternatively predetermined) range, according to some example embodiments.

FIG. 8 is a flowchart illustrating a method of generating an output code based on whether a first input code is within a desired (and/or alternatively predetermined) range, according to some example embodiments.

Referring to FIG. 8, the control logic circuit 110 (or the phase-locked loop circuit 100) according to some example embodiments may generate an output code based on whether a first input code is within a desired (and/or alternatively predetermined) range.

In operation S15, the control logic circuit 110 may determine whether the first input code is within the desired (and/or alternatively predetermined) range.

For example, the control logic circuit 110 may determine whether the first input code corresponds to a single code, among input codes within the desired (and/or alternatively predetermined) range.

For example, the control logic circuit 110 may determine whether the first input code is a code within the desired (and/or alternatively predetermined) range of "255" to "767."

In operation S20, the control logic circuit 110 may generate a first output code corresponding to the first input code within the desired (and/or alternatively predetermined) range.

For example, the control logic circuit 110 may generate a first output code corresponding to the first input code when the generated first input code is within the desired (and/or alternatively predetermined) range.

For example, the control logic circuit 110 may generate a first output code "2" in response to a first input code "256," falling within the desired (and/or alternatively predetermined) range of "255" to "767," being generated.

In operation S21, the control logic circuit 110 may generate a desired (and/or alternatively predetermined) output code when the generated input code is outside the desired (and/or alternatively predetermined) range.

For example, the control logic circuit 110 may generate an output code corresponding to a first boundary code in response to an input code, less than the first boundary code within the desired (and/or alternatively predetermined) range, being generated.

The control logic circuit 110 may generate an output code corresponding to a second boundary code in response to an input code, greater than the second boundary code within the desired (and/or alternatively predetermined) range, being generated.

For example, when the control logic circuit 110 generates a first input code "200," which is outside the desired (and/or alternatively predetermined) range of "255" to "767," it may generate an output code corresponding to the input code "255."

When the control logic circuit 110 generates a first input code "1000," which is outside the desired (and/or alternatively predetermined) range of "255" to "767," it may generate an output code corresponding to the input code "767."

In operation S31, the control logic circuit 110 may control at least two capacitor cells based on the generated output code.

For example, the control logic circuit 110 may control at least two capacitor cells, among the plurality of capacitor cells C11 to Cnn, based on the generated output code.

The operation of the control logic circuit 110 controlling at least two capacitor cells, among the plurality of capacitor cells C11 to Cnn, based on the generated output code may be understood as substantially the same as the operation of the control logic circuit 110 controlling at least two capacitor cells in operation S30 of FIG. 7.

For example, the control logic circuit 110 may ground at least two capacitor cells, among the plurality of capacitor cells C11 to Cnn, based on the generated output code. Further, the control logic circuit 110 may connect capacitor cells other than the grounded capacitor cells, among the plurality of capacitor cells C11 to Cnn, to a power supply voltage.

For example, the control logic circuit 110 may connect at least two capacitor cells, among the plurality of capacitor cells C11 to Cnn, to the power supply voltage based on the generated output code.

Further, the oscillator 120 may output a second signal having a second frequency through an electrical path including capacitor cells connected to the power supply voltage, among the plurality of capacitor cells C11 to Cnn.

The oscillator 120 may output a second signal having a second frequency through an electrical path including capacitor cells other than the grounded capacitor cells, among the plurality of capacitor cells C11 to Cnn.

Referring to the above-described configurations, the control logic circuit 110 may generate a first input code based on a result of the comparison between the first frequency of the first signal, output from the oscillator 120, and the target frequency.

The control logic circuit 110 may generate a first output code, which corresponds to the first input code and is used to control at least two capacitor cells, in response to the first input code within a desired (and/or alternatively predetermined) range being generated.

The control logic circuit 110 may generate a desired (and/or alternatively predetermined) code as an output code in response to the first input code outside the desired (and/or alternatively predetermined) range being generated.

Further, the control logic circuit 110 may control at least two capacitor cells, included in the oscillator 120, based on the generated output code.

As a result, the phase-locked loop circuit 100 according to some example embodiments may reduce the time required for the oscillator 120 to output a signal having the target frequency.

Figure 9:
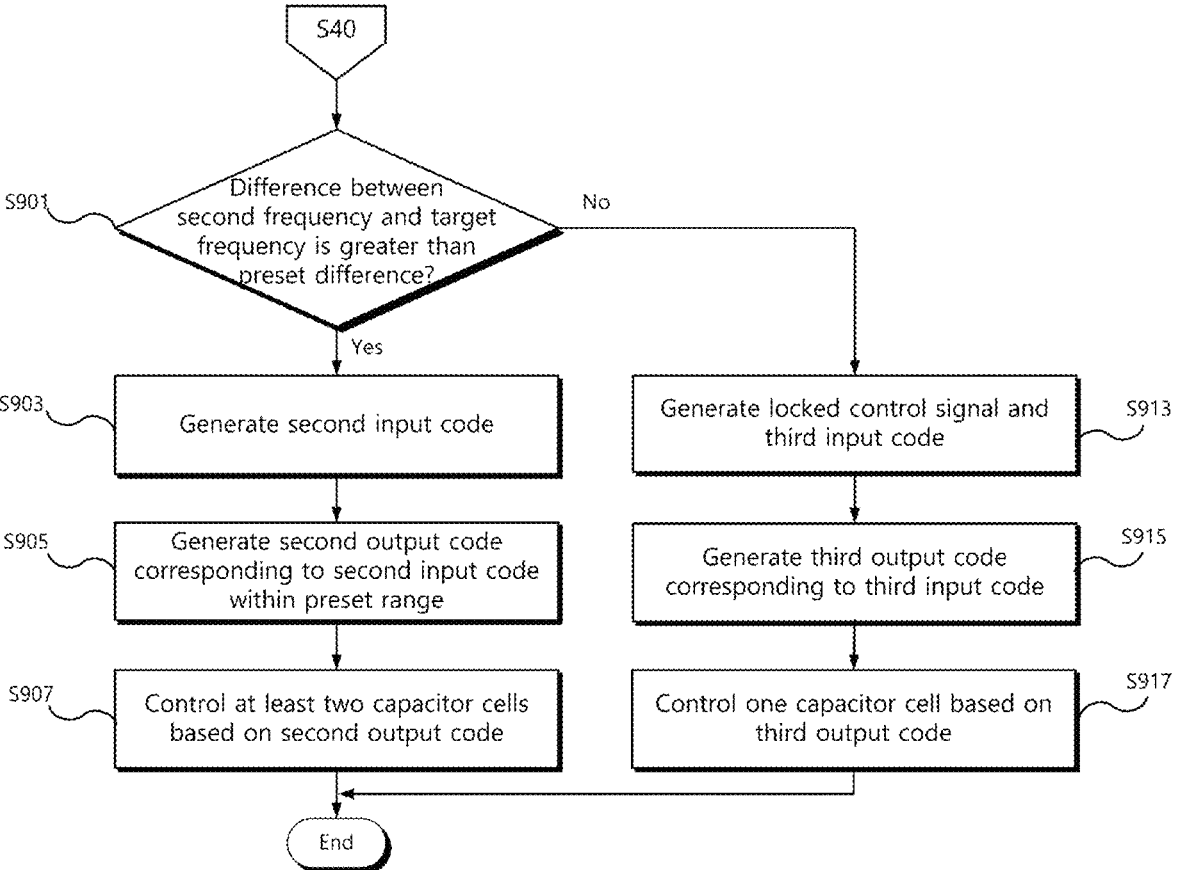
FIG. 9 is a flowchart illustrating a method of generating an output code based on a difference between a frequency of a signal output from an oscillator and a target frequency, according to some example embodiments.

FIG. 9 is a flowchart illustrating a method of generating an output code based on a difference between a frequency of a signal output from an oscillator and a target frequency, according to an Some example embodiments.

Referring to FIG. 9, the control logic circuit 110 (or the phase-locked loop circuit 100) according to some example embodiments may generate an output code based on a difference between a second frequency of a second signal, generated from the oscillator 120, and a target frequency.

In operation S901, the control logic circuit 110 may determine whether a difference between a second frequency of a second signal and a target frequency is greater than a desired (and/or alternatively predetermined) difference.

The desired (and/or alternatively predetermined) difference may be understood as a reference value to determine whether a phase of a signal, output from the oscillator 120, is locked.

For example, when the difference between the second frequency of the second signal and the target frequency is less than or equal to the preset difference, it may be determined that the phase of the signal, output from the oscillator 120 (or the phase-locked loop circuit 100), is locked.

For example, when the difference between the second frequency of the second signal and the target frequency is greater than the desired (and/or alternatively predetermined) difference, it may be determined that the phase of the signal, output from the oscillator 120 (or the phase-locked loop circuit 100), is not locked.

In operation S903, the control logic circuit 110 may generate a second input code.

For example, when the difference between the second frequency and the target frequency is greater than or equal to the desired (and/or alternatively predetermined) difference, the control logic circuit 110 may generate a second input code to control at least a portion of the plurality of capacitor cells.

For example, when the difference between the second frequency and the target frequency is greater than or equal to the preset difference, the control logic circuit 110 may generate a second input code to control at least two capacitor cells such that the oscillator 120 outputs a signal having the target frequency.

In operation S905, the control logic circuit 110 may generate a second output code corresponding to the second input code within a desired (and/or alternatively predetermined) range.

For example, the control logic circuit 110 may generate a second output code corresponding to the second input code when the generated second input code is within the desired (and/or alternatively predetermined) range.

For example, the control logic circuit 110 may generate a second output code "4" corresponding to a second input code "257" falling within the desired (and/or alternatively predetermined) range of "255" to "767."

In operation S907, the control logic circuit 110 may control at least two capacitor cells based on the second output code.

For example, the control logic circuit 110 may control at least two capacitor cells, among the plurality of capacitor cells C11 to Cnn, based on the second output code.

The operation of the control logic circuit 110 controlling at least two capacitor cells, among the plurality of capacitor cells C11 to Cnn, based on the second output code may be understood as substantially the same as the operation of the control logic circuit 110 controlling at least two capacitor cells in operation S30 of FIG. 7.

For example, the control logic circuit 110 may ground at least two capacitor cells, among the plurality of capacitor cells C11 to Cnn, based on the second output code.

For example, the control logic circuit 110 may connect at least two capacitor cells, among the plurality of capacitor cells C11 to Cnn, to the power supply voltage based on the second output code.

In operation S913, when the difference between the second frequency and the target frequency is less than or equal to the desired (and/or alternatively predetermined) difference, the control logic circuit 110 may generate a locked control signal and a third input code.

For example, when the difference between the second frequency and the target frequency is less than or equal to the desired (and/or alternatively predetermined) difference, the control logic circuit 110 may generate a locked control signal including information indicating whether the signal output from the oscillator 120 is locked.

The control logic circuit 110 may generate a third input code to control one of the plurality of capacitor cells.

In operation S915, the control logic circuit 110 may generate a third output code corresponding to the third input code.

For example, the control logic circuit 110 may generate a third output code corresponding to the third input code in response to the locked control signal.

For example, the control logic circuit 110 may generate a third output code "257" corresponding to the third input code "257" in response to the locked control signal.

The plurality of output codes may correspond to the plurality of input codes, respectively. For example, the output codes "0" to "1023" may correspond to the input codes "0" to "1023," respectively.

In operation S917, the control logic circuit 110 may control a single capacitor cell based on the third output code. For example, the third output code may be understood as a thermometer code.

For example, the control logic circuit 110 may control one of the plurality of capacitor cells C11 to Cnn based on the third output code.

For example, the control logic circuit 110 may ground one of the plurality of capacitor cells C11 to Cnn based on the third output code.

For example, the control logic circuit 110 may connect one of the plurality of capacitor cells C11 to Cnn to the power supply voltage based on the third output code.

Referring to the above-described configurations, the control logic circuit 110 may determine whether the signal output from the oscillator 120 is phase-locked based on a result of comparison between the second frequency of the second signal, output from the oscillator 120, and the target frequency.

The control logic circuit 110 may generate different input codes based on whether the signal, output from the oscillator 120, is phase-locked.

Further, the control logic circuit 110 may control at least a portion of the plurality of capacitor cells C11 to Cnn based on the output code corresponding to the generated input code.

For example, the control logic circuit 110 may control the oscillator 120 using different codes depending on whether the signal output from the oscillator 120 is phase-locked.

Thus, the phase-locked loop circuit 100 according to some example embodiments may omit an additional component configured to control the oscillator 120 in a state in which the signal is phase-locked. As a result, the phase-locked loop circuit 100 according to some example embodiments may reduce a circuit area.

Figure 10:
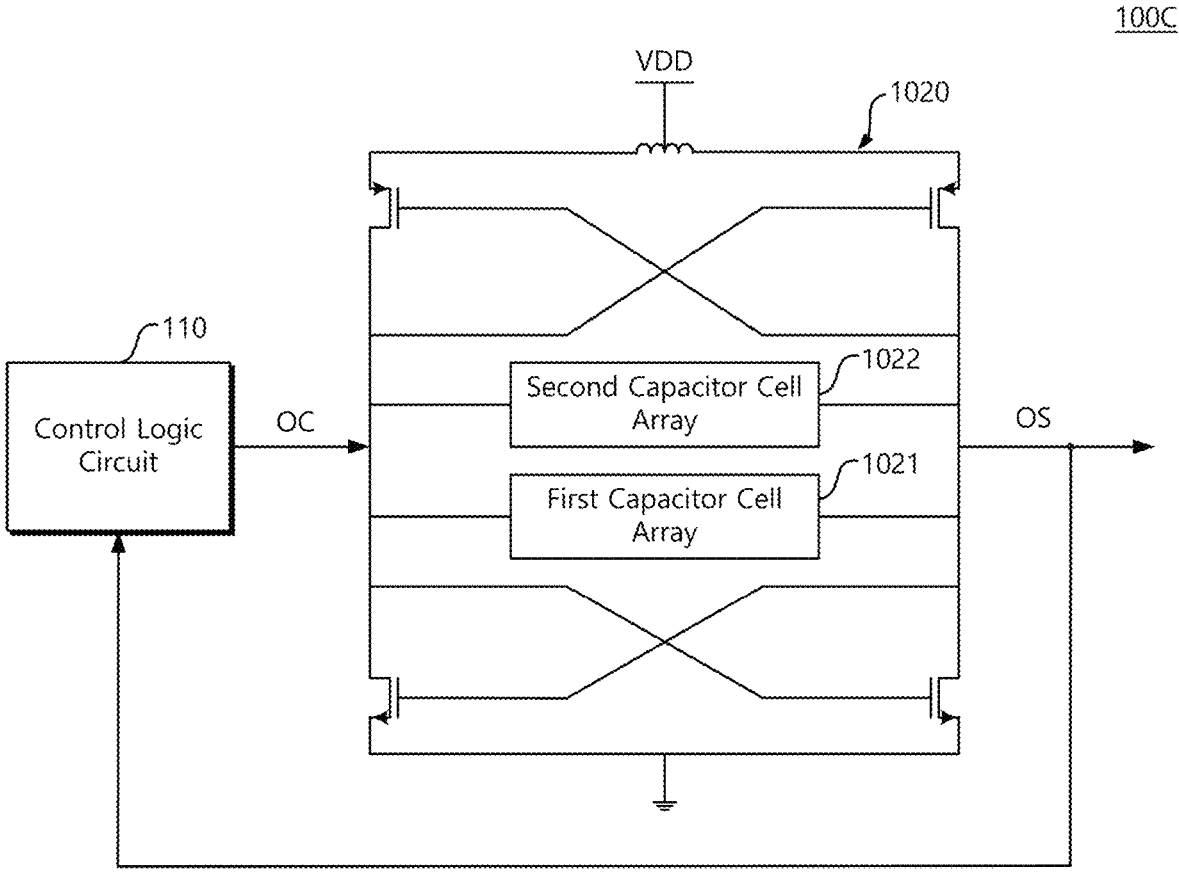
FIG. 10 is a diagram illustrating a phase-locked loop circuit including a first capacitor cell array and a second capacitor cell array, according to some example embodiments.

FIG. 10 is a diagram illustrating a phase-locked loop circuit including a first capacitor cell array and a second capacitor cell array, according to some example embodiments.

Referring to FIG. 10, a phase-locked loop circuit 100C according to some example embodiments may include a control logic circuit 110 and an oscillator 1020.

The phase-locked loop circuit 100C illustrated in FIG. 10 may be understood as an example of the phase-locked loop circuit 100 illustrated in FIG. 1A. Therefore, the same or substantially the same components are represented by the same reference numbers, and redundant descriptions will be omitted.

According to some example embodiments, the oscillator 1020 may include a first capacitor cell array 1021 and a second capacitor cell array 1022. For example, the oscillator 1020 may include a first capacitor cell array 1021 and a second capacitor cell array 1022 connected in parallel to each other.

The first capacitor cell array 1021 may be understood as having substantially the same configuration as the capacitor cell array 121 illustrated in FIG. 1A.

Accordingly, the first capacitor cell array 1021 may include a plurality of capacitor cells arranged in the form of a matrix. Each of the plurality of capacitor cells included in the first capacitor cell array 1021 may include at least one capacitor having desired (and/or alternatively predetermined) capacitance.

The second capacitor cell array 1022 according to some example embodiments may include a plurality of capacitor cells arranged in the form of a matrix.

Each of the capacitor cells included in the second capacitor cell array 1022 may include a capacitor having higher capacitance than the capacitor of each of the capacitor cells included in the first capacitor cell array 1021.

According to some example embodiments, the control logic circuit 110 may control at least two capacitor cells, among the plurality of capacitor cells included in the first capacitor cell array 1021, when a difference between a frequency of an output signal OS and a target frequency is less than or equal to a reference value.

In some example embodiments, the control logic circuit 110 may control at least a portion of the plurality of capacitor cells, included in the second capacitor cell array 1022, when a difference between a frequency of an output signal OS and a target frequency is greater than a reference value.

For example, the control logic circuit 110 may control at least two capacitor cells, among the plurality of capacitor cells included in the second capacitor cell array 1022, based on an output code OC when the difference between the frequency of the output signal OS the target frequency is greater than the reference value.

For example, the control logic circuit 110 may adjust a frequency when controlling the second capacitor cell array 1022 to control a frequency of the output signal OS relatively more than when controlling the first capacitor cell array 1021 to control the frequency of the output signal OS. For example, the control logic circuit 110 may adjust a frequency of the output signal OS by a relatively greater degree when controlling the second capacitor cell array 1022 than when controlling the first capacitor cell array 1021.

Thus, the phase-locked loop circuit 100C according to some example embodiments may reduce the time required for the oscillator 1020 to output a signal having the target frequency.

As described above, the control logic circuit 110 according to some example embodiments may generate an output code OC having a difference of at least "2" to correspond to each input code IC generated within a desired (and/or alternatively predetermined) range.

For example, the control logic circuit 110 may generate an output code OC for controlling at least two capacitor cells to correspond to each input code IC within a desired (and/or alternatively predetermined) range.

Further, the control logic circuit 110 may control at least two capacitor cells based on the output code OC generated to correspond to each input code IC within the desired (and/or alternatively predetermined) range.

Accordingly, the control logic circuit 110 may control at least two capacitor cells to correspond to the input code IC generated by a single operation of comparing the frequency of the output signal OS with the target frequency.

As a result, the phase-locked loop circuit 100 according to some example embodiments may reduce the time required to control a plurality of capacitor cells C11 to Cnn such that the oscillator 120 is controlled to output a signal having a target frequency.

The control logic circuit 110 may control at least two capacitor cells to correspond to each input code in a state in which the target frequency is a relatively low band frequency.

As a result, the phase-locked loop circuit 100 according to some example embodiments may reduce the time required for the oscillator 120 to output a signal having the target frequency in a state in which the target frequency is relatively low.

The phase-locked loop circuit 100 according to some example embodiments may maintain the time required for the oscillator 120 to output a signal having the target frequency and a gain of the oscillator 120, regardless of a magnitude of the target frequency.

As set forth above, a phase-locked loop circuit according to some example embodiments may control at least two capacitor cells in response to each digital code within a specified range, among digital codes generated based on a frequency of a signal output through an oscillator.

As a result, the phase-locked loop circuit may reduce the time required to output a signal having a specified frequency.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, an application-specific integrated circuit (ASIC), etc.

While some example embodiments have been shown and described above, it will be apparent to those skilled in the art that modifications and variations could be made without departing from the scope of the present inventive concepts as defined by the appended claims.

What is claimed is:

1. A phase-locked loop circuit comprising:
an oscillator comprising a capacitor cell array including a plurality of capacitor cells, wherein each of the plurality of capacitor cells corresponds to a distinct row-column position in the capacitor cell array; and
a control logic circuit configured to receive an output from the oscillator,
wherein the control logic circuit is configured to
compare a target frequency with a first frequency of a first signal output from the oscillator,
generate a first input code based on the comparison of the target frequency with the first frequency,
generate a first output code based on the first input code when the first input code is within a predetermined range of input codes, and
adjust a state of at least two capacitor cells from among the plurality of capacitor cells based on the first output code, and
wherein the oscillator is configured to output a second signal having a second frequency through an electrical path comprising capacitor cells other than grounded capacitor cells from among the plurality of capacitor cells.

2. The phase-locked loop circuit of claim 1, wherein the control logic circuit comprises:
a dithering circuit configured to dither the first input code and generate a dithering signal based on the dithered first input code; and
a decoder configured to decode the dithering signal and generate the first output code corresponding to the first input code based on the decoded dithering signal.

3. The phase-locked loop circuit of claim 2, wherein the control logic circuit is configured to
generate a locked control signal and a third input code based on a difference between the second frequency and the target frequency being less than a predetermined difference;
output a third output code corresponding to the third input code in response to the locked control signal; and
control a single capacitor cell from among the plurality of capacitor cells based on the third output code.

4. The phase-locked loop circuit of claim 1, wherein the control logic circuit is configured to
generate a second input code based on a difference between the second frequency and the target frequency being greater than or equal to a predetermined difference;
generate a second output code based on the second input code when the second input code is within the predetermined range of input codes; and
adjust a state of at least another two capacitor cells from among the plurality of capacitor cells based on the second output code.

5. The phase-locked loop circuit of claim 1, wherein the control logic circuit is configured to output a predetermined code as a second output code based on a second input code being outside the predetermined range of input codes.

6. The phase-locked loop circuit of claim 5, wherein the control logic circuit is configured to:
output an output code corresponding to a first boundary code of the predetermined range of input codes as the second output code based on the second input code being less than the first boundary code; or output an output code corresponding to a second boundary code of the predetermined range of input codes as the second output code based on the second input code being greater than the second boundary code.

7. The phase-locked loop circuit of claim 1, further comprising:

a controller configured to generate control signals and control the control logic circuit based on the control signals, wherein the controller is configured to:

generate a first control signal configured to cause the control logic circuit to generate an output code that adjusts a state of two or more capacitor cells from among the plurality of capacitor cells based on the target frequency being less than a reference frequency; and generate a second control signal configured to cause the control logic circuit to generate an output code that adjusts a state of a single capacitor cell from among the plurality of capacitor cells based on the target frequency being greater than or equal to the reference frequency.

8. The phase-locked loop circuit of claim 1, further comprising:

a plurality of row control lines and a plurality of column control lines, respectively connected to the plurality of capacitor cells;

a row decoder connected to the plurality of row control lines; and a column decoder connected to the plurality of column control lines, wherein the row decoder is configured to decode the first output code to provide a first decoded output code, and select at least a portion of the plurality of row control lines based on the first decoded output code, and the column decoder is configured to decode the first output code to provide a second decoded output code, and select at least a portion of the plurality of column control lines based on the second decoded output code.

9. The phase-locked loop circuit of claim 1, wherein the control logic circuit is configured to ground the at least two capacitor cells based on the first output code.

10. The phase-locked loop circuit of claim 1, wherein the control logic circuit is configured to connect the at least two capacitor cells to a power supply voltage based on the first output code.

11. A method of controlling a phase-locked loop circuit, the method comprising:

comparing a target frequency with a first frequency of a first signal output from an oscillator of the phase-locked loop circuit;

generating a first input code based on the comparing;

generating a first output code based on the first input code when the first input code is within a predetermined range of input codes;

adjusting a state of at least two capacitor cells from among a plurality of capacitor cells based on the first output code, wherein each of the plurality of capacitor cells corresponds to a distinct row-column position in a capacitor cell array of the phase-locked loop circuit; and outputting, by the oscillator, a second signal having a second frequency through an electrical path comprising capacitor cells from among the plurality of capacitor cells that are connected to a power supply voltage.

12. The method of claim 11, further comprising:

generating a second input code based on a difference between the second frequency and the target frequency being greater than or equal to a predetermined difference;

outputting a second output code based on the second input code when the second input code is within the predetermined range; and adjusting a state of at least another two capacitor cells from among the plurality of capacitor cells based on the second output code.

13. The method of claim 11, further comprising:

generating a locked control signal and a third input code based on a difference between the second frequency and the target frequency being less than a predetermined difference;

generating a third output code corresponding to the third input code in response to the locked control signal; and adjusting a state of a single capacitor cell from among the plurality of capacitor cells based on the third output code.

14. The method of claim 11, comprising at least one of:

outputting a second output code corresponding to a first boundary code of the predetermined range of input codes based on a second input code being less than the first boundary code; or outputting a third output code corresponding to a second boundary code of the predetermined range of input codes based on a third input code being greater than the second boundary code.

15. The method of claim 11, wherein adjusting the state of the at least two capacitor cells comprises grounding the at least two capacitor cells, wherein the at least two capacitor cells are selected by the first output code.

16. A phase-locked loop device comprising:

an oscillator comprising a plurality of capacitor cells respectively connected to a plurality of row control lines and a plurality of column control lines; and a control logic circuit configured to receive an output from the oscillator, wherein the control logic circuit is configured to output a first output code based on a result of comparison between a target frequency and a first frequency of a first signal output from the oscillator, wherein the first output code adjusts a state of at least two capacitor cells from among the plurality of capacitor cells, and wherein the oscillator is configured to output a second signal having a second frequency through an electrical path comprising capacitor cells other than grounded capacitor cells from among the plurality of capacitor cells, based on the first output code.

17. The phase-locked loop device of claim 16, wherein the control logic circuit is configured to:

generate a first input code based on the result of the comparison between the target frequency and the first frequency;

generate the first output code corresponding to the first input code based on a correspondence between an ordered plurality of input codes and a corresponding plurality of output codes; and adjust the state of the at least two capacitor cells from among the plurality of capacitor cells based on the first output code, wherein the adjusted state of the at least two capacitor cells is modified compared to a state of the at least two capacitor cells corresponding to a second output code, wherein the second output code corresponds to a second input code that is adjacent to the first input code in the ordered plurality of input codes.

18. The phase-locked loop device of claim 17, wherein the control logic circuit is configured to:

output an output code corresponding to a first boundary code of a predetermined range of input codes based on a third input code being less than the first boundary code; and output an output code corresponding to a second boundary code of the predetermined range of input codes based on a fourth input code being greater than the second boundary code.

19. The phase-locked loop device of claim 16, wherein the control logic circuit is configured to ground the at least two capacitor cells based on the first output code.

20. The phase-locked loop device of claim 19, wherein the control logic circuit is configured to connect capacitor cells from among the plurality of capacitor cells other than the at least two capacitor cells to a power supply voltage.

* * * * *